United States Patent [19]
Roy

[11] Patent Number: 4,631,804
[45] Date of Patent: Dec. 30, 1986

[54] TECHNIQUE FOR REDUCING SUBSTRATE WARPAGE SPRINGBACK USING A POLYSILICON SUBSURFACE STRAINED LAYER

[75] Inventor: Pradip K. Roy, Reading, Pa.

[73] Assignee: AT&T Bell Laboratories, Murray Hill, N.J.

[21] Appl. No.: 680,344

[22] Filed: Dec. 10, 1984

[51] Int. Cl.$^4$ .................. H01L 21/304; H01L 21/316
[52] U.S. Cl. .................................. 29/576 W; 29/580; 148/174; 148/175; 148/DIG. 25; 148/DIG. 85; 148/DIG. 86; 148/DIG. 135; 148/DIG. 122; 357/49; 427/86
[58] Field of Search ........... 29/576 W, 580; 148/174, 148/175, DIG. 25, DIG. 85, DIG. 86, DIG. 135, DIG. 122; 357/49; 427/86

[56] References Cited

U.S. PATENT DOCUMENTS

| | | | |
|---|---|---|---|
| 4,079,506 | 3/1978 | Suzuki et al. | 29/576 W |
| 4,144,099 | 3/1979 | Edmonds et al. | 148/1.5 |
| 4,173,674 | 11/1979 | Mimura et al. | 357/59 X |
| 4,276,114 | 6/1981 | Takano et al. | 156/645 |
| 4,310,965 | 1/1982 | Horiuchi et al. | 357/49 X |
| 4,390,392 | 6/1983 | Robinson et al. | 156/643 |
| 4,410,395 | 10/1983 | Weaver et al. | 156/662 |
| 4,411,060 | 10/1983 | Cho | 29/576 W |

OTHER PUBLICATIONS

"Formation of SiO$_2$ Films . . . ", *Jap. J. Appl. Phys.*, vol. 5, 1966, Watanabe et al., pp. 737–738.
"Disorder Produced by High-Dose . . . ", *Appl. Phys. Lett.*, vol. 29, No. 10, 11/15/76, T. Sigmon, pp. 645–648.
"C.M.O.S. Devices Fabricated on Buried . . . ", *Elec. Lett.*, vol. 14, No. 18, 8/31/78, Izumi et al., pp. 593–594.
"Low-Temperature Process to Increase . . . ", *Elec. Lett.*, vol. 17, No. 17, 8/20/81, Reif et al., pp. 586–588.

*Primary Examiner*—Brian E. Hearn
*Assistant Examiner*—John T. Callahan
*Attorney, Agent, or Firm*—Wendy W. Koba

[57] ABSTRACT

A technique is disclosed for the artificial introduction of a localized subsurface strained layer within a thick polysilicon layer to minimize the large change in warpage (defined as springback) which occurs in a (100) Si substrate thinning operation during the mechanical processing of dielectrically isolated (DI) wafers. This novel technique is capable of favorably altering the state of stress and the stress profile in the multicomponent "polysilicon/SiO$_2$/(100) Si" DI structure so as to reduce the natural springback in warpage that occurs when the stiffening member, the (100) Si substrate, is removed. This subsurface disturbed layer is retained within the polysilicon layer during subsequent processing to maintain the favorable stress profile with a minimum of wafer warpage. In one embodiment of the present invention, the subsurface strained layer is generated by growing an interface layer (SiO$_2$ or Si$_3$N$_4$) onto a first polysilicon layer onto which a second polysilicon layer is deposited to attain the desired thickness. In an alternative embodiment, a polysilicon grind is performed on a first layer and a second polysilicon layer is deposited on this ground surface, where the disturbed layer results from the mechanical grind operation. Alternatively, a subsurface psuedo interface may be formed by a sudden radical change in the growth rate of the actual polysilicon deposition process, where the highly strained and defective layer results from the drastic quench in the polysilicon growth rate.

15 Claims, 23 Drawing Figures

FIG. 4
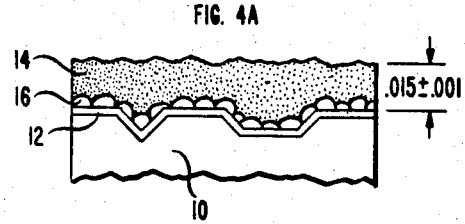
FIG. 4A
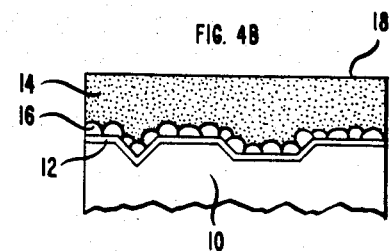
FIG. 4B
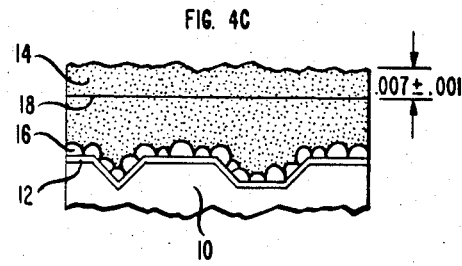
FIG. 4C
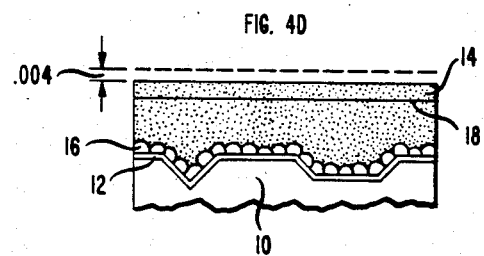
FIG. 4D
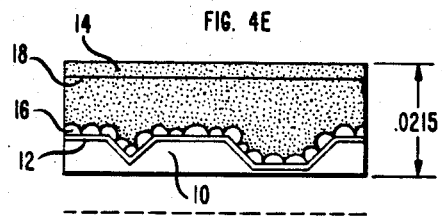
FIG. 4E
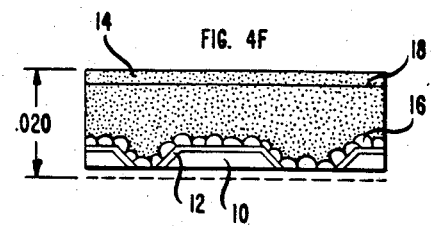
FIG. 4F

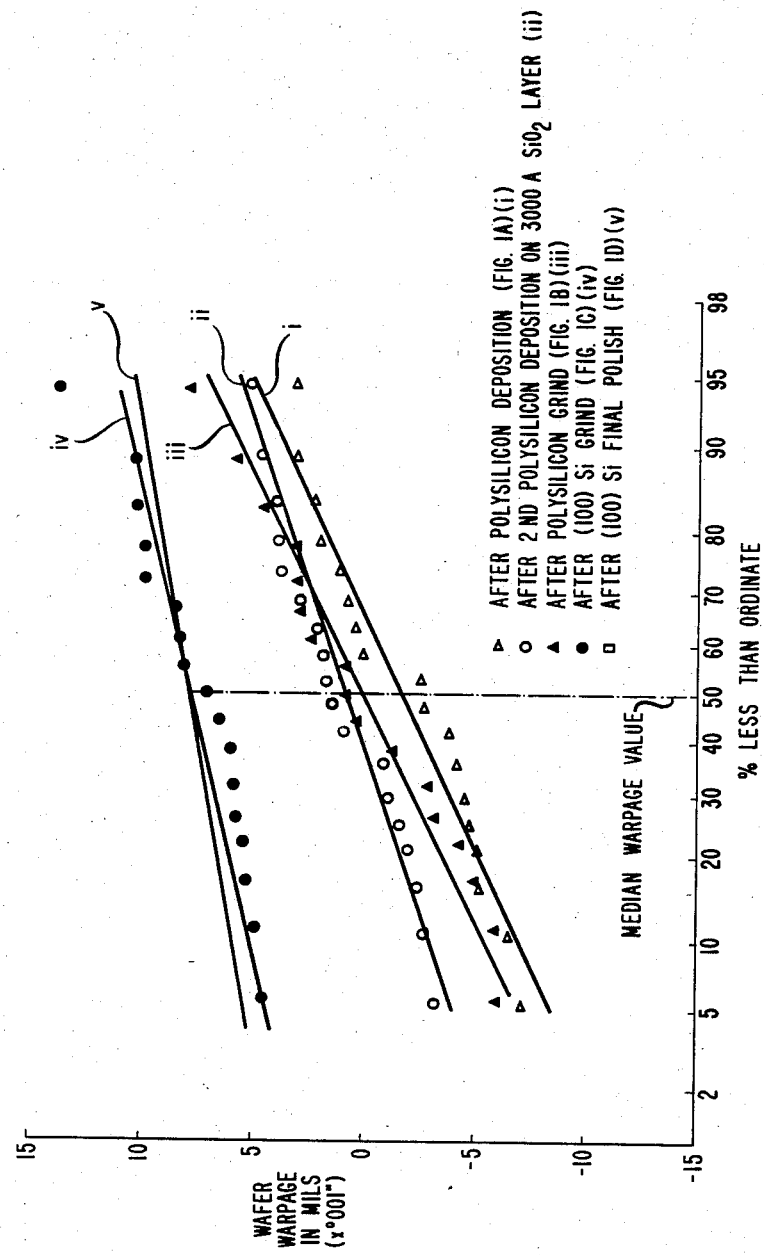

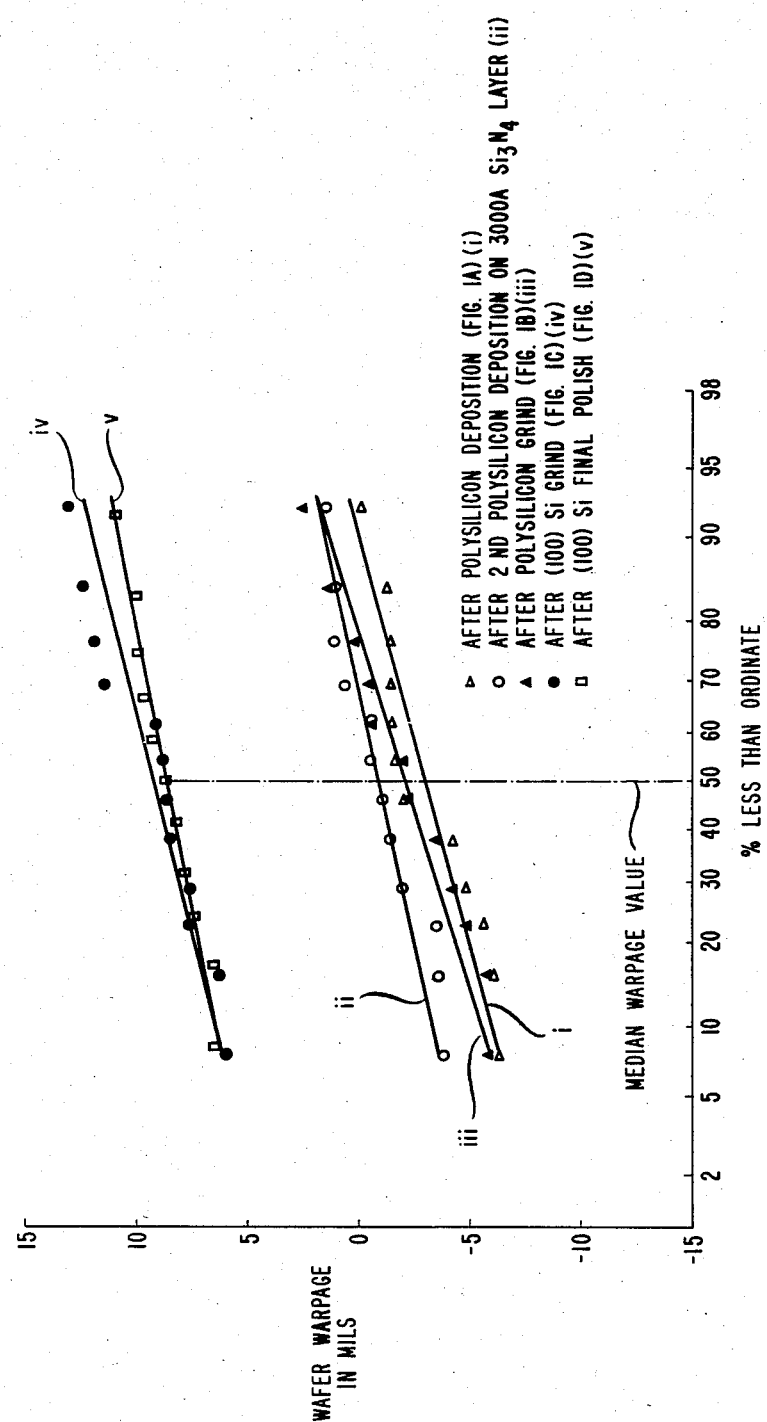

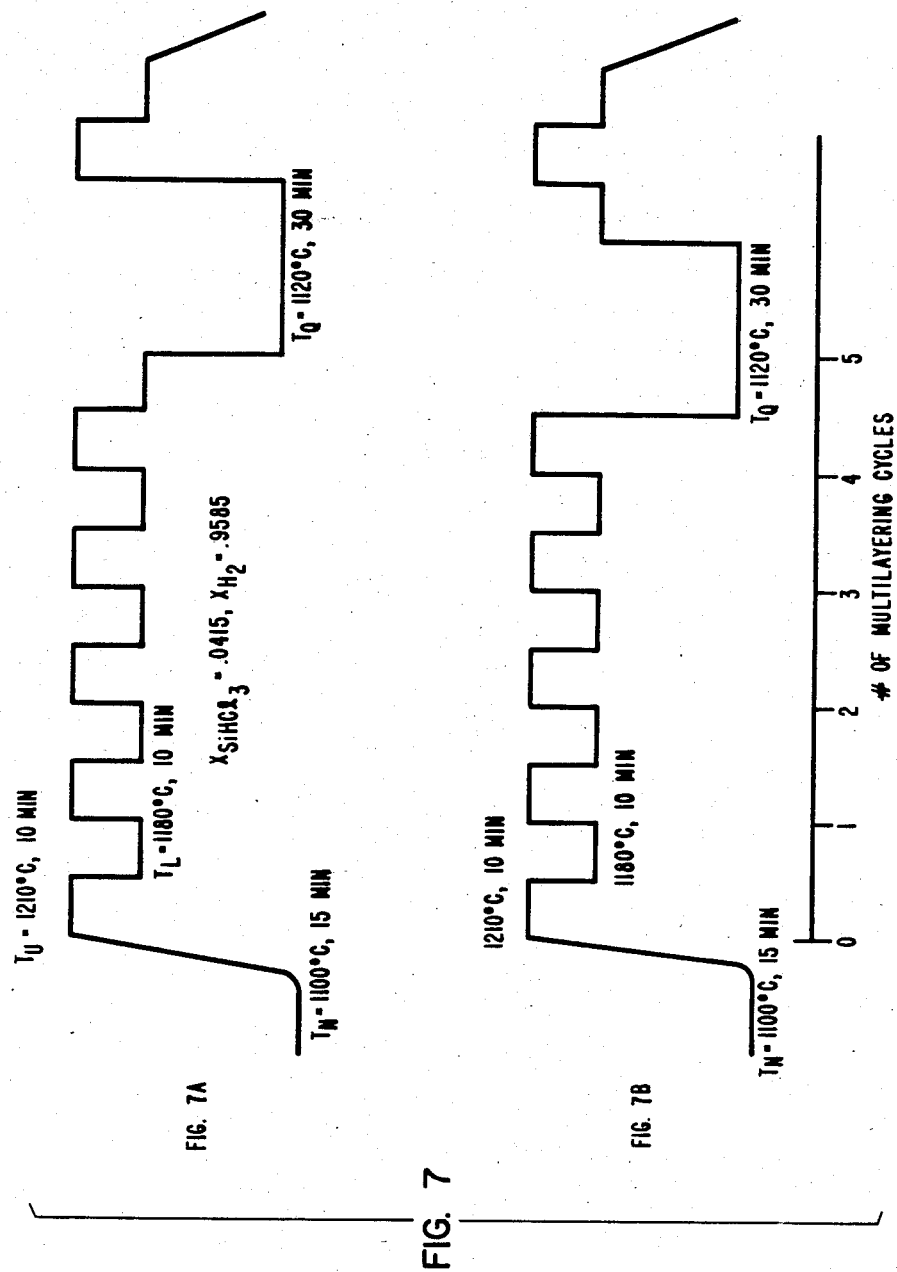

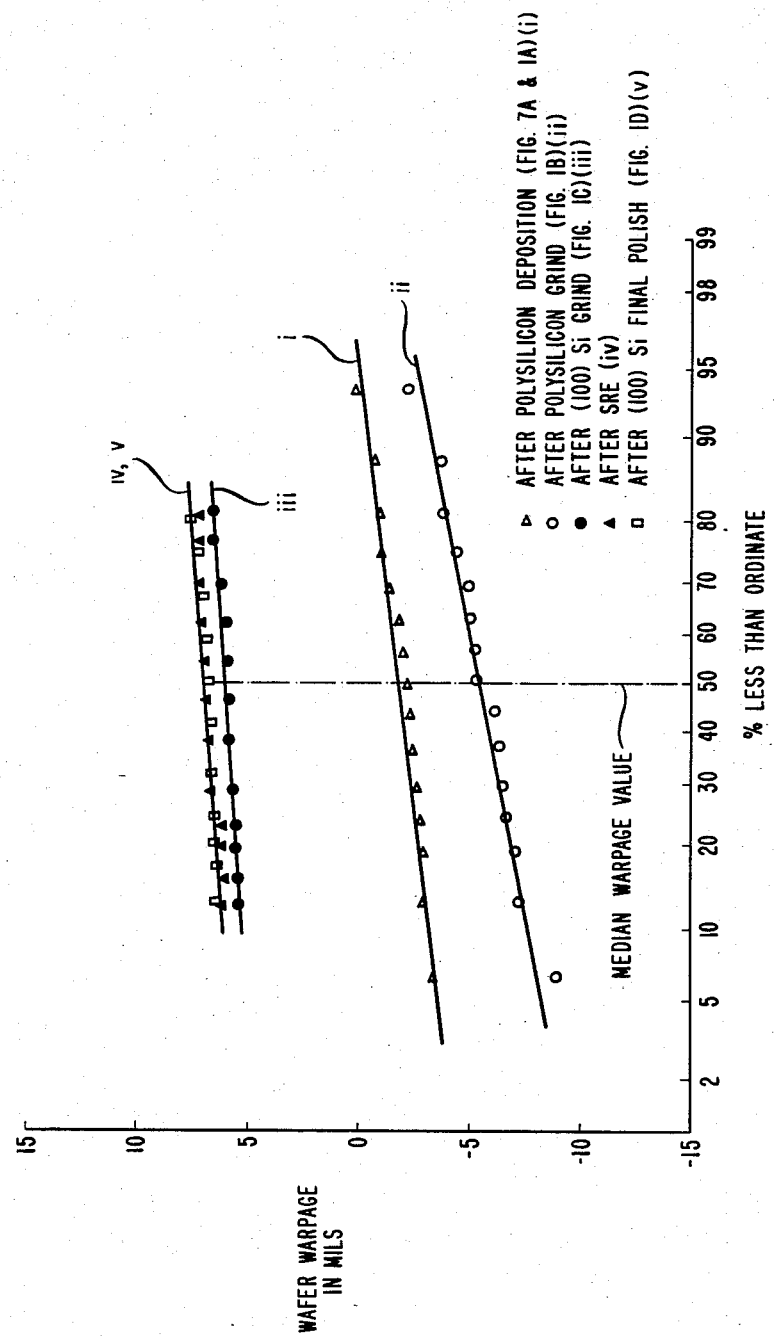

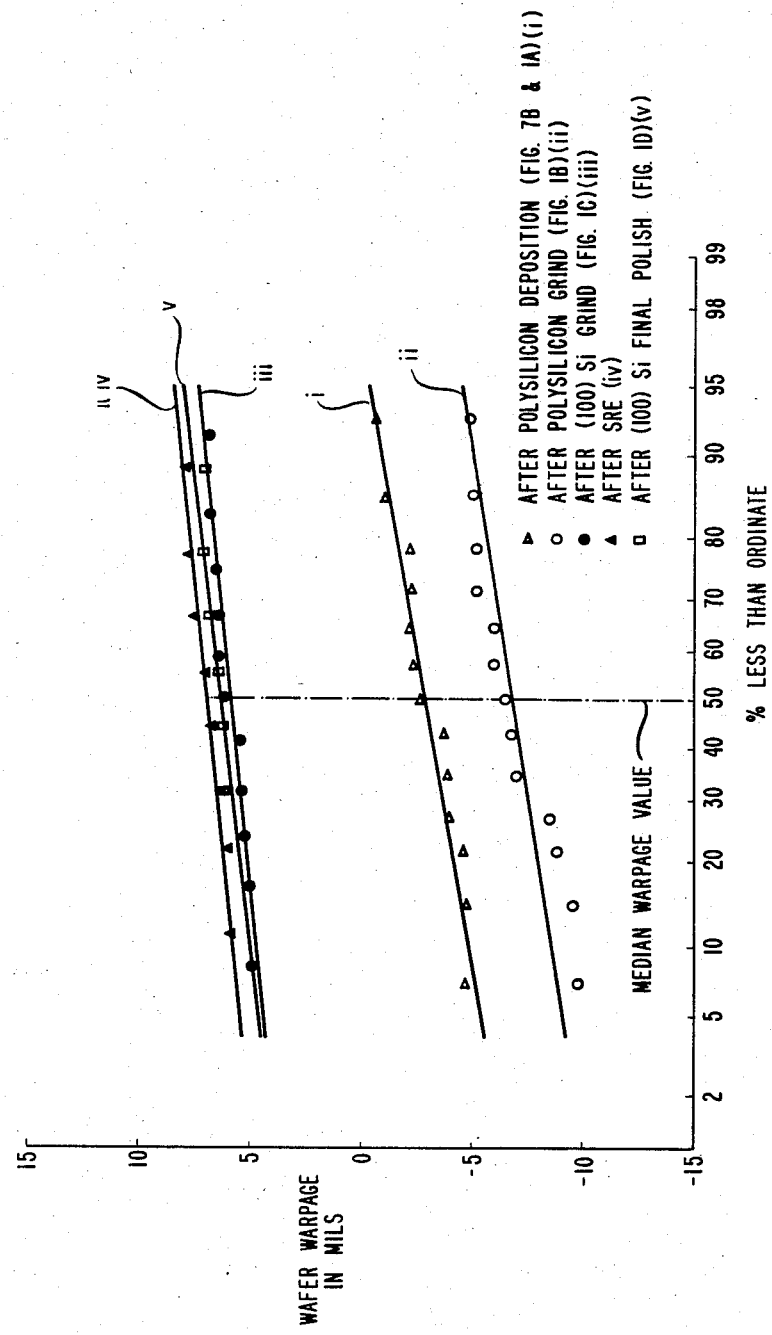

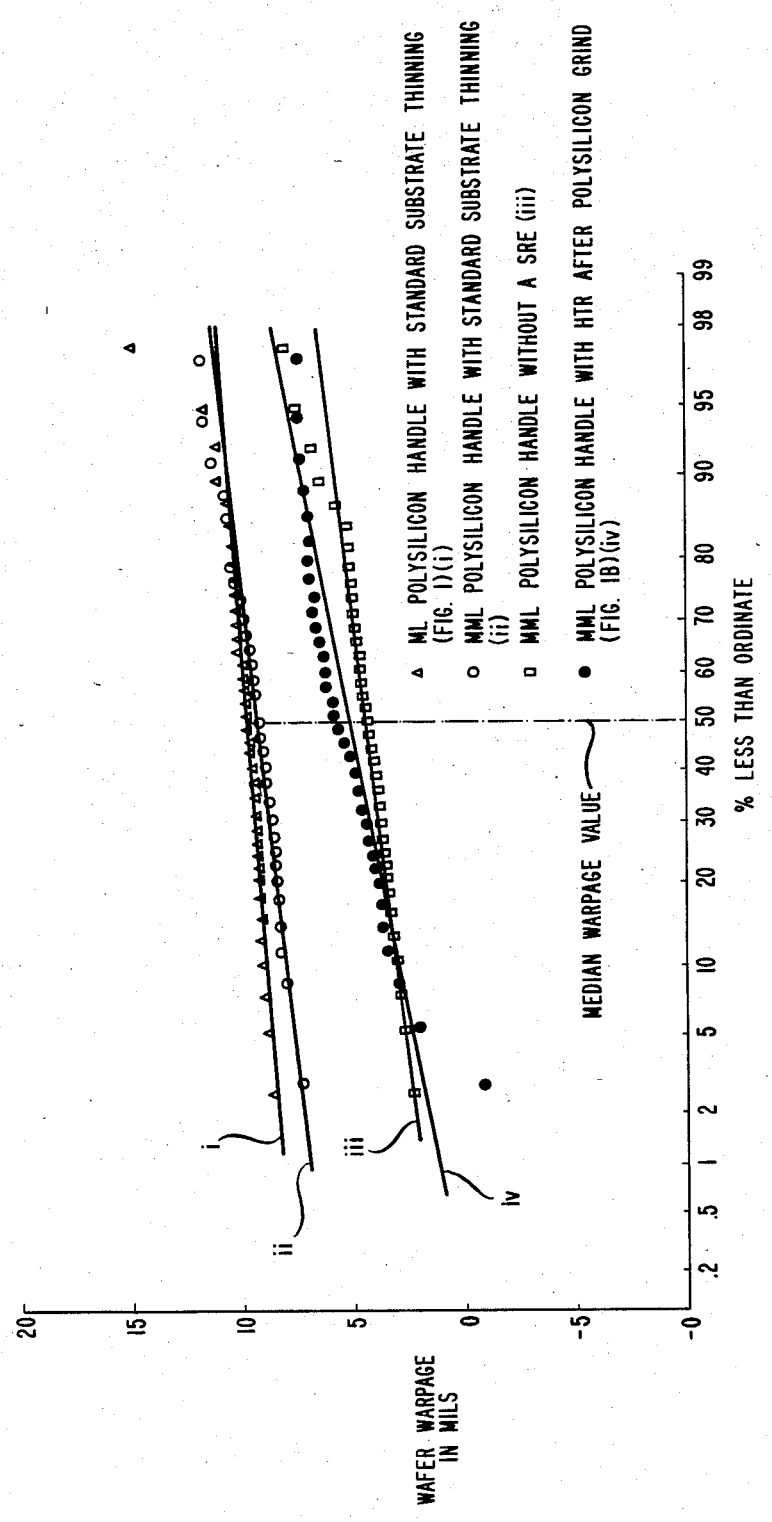

FIG. 12
MODIFIED MULTILAYERING PROCESS
FIG. 12A
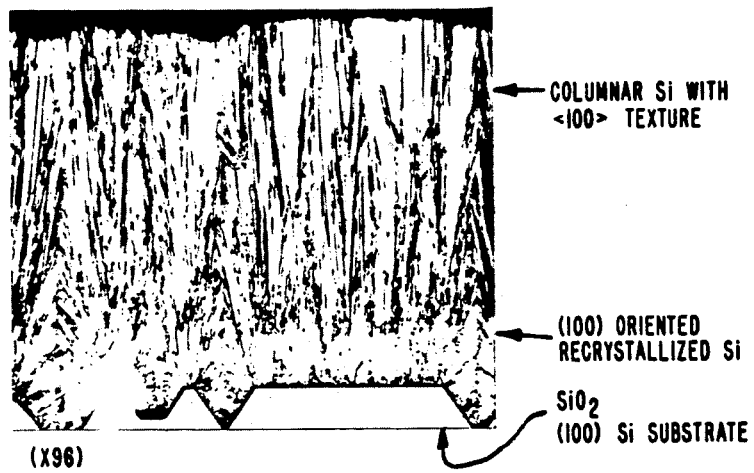
(X96)
— COLUMNAR Si WITH <100> TEXTURE
— (100) ORIENTED RECRYSTALLIZED Si
— SiO$_2$ / (100) Si SUBSTRATE
DUAL POLYGRINDING PROCESS
FIG. 12B
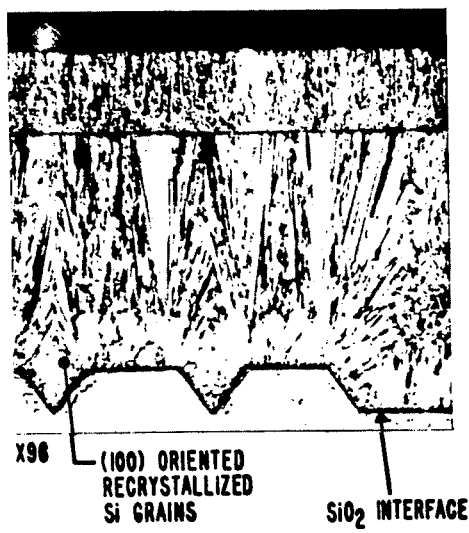
X96 — (100) ORIENTED RECRYSTALLIZED Si GRAINS — SiO$_2$ INTERFACE
FIG. 12C
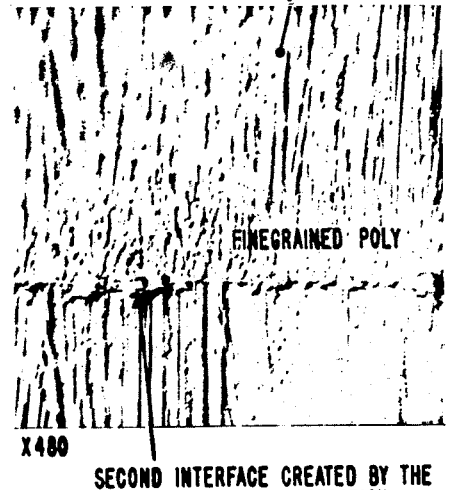
COLUMNAR POLY WITH <110> TEXTURE
FINEGRAINED POLY
X480 — SECOND INTERFACE CREATED BY THE FIRST POLYGRINDING OPERATION

TECHNIQUE FOR REDUCING SUBSTRATE WARPAGE SPRINGBACK USING A POLYSILICON SUBSURFACE STRAINED LAYER

BACKGROUND OF THE INVENTION

1. Field of the Invention

The present invention relates to a technique for reducing the warpage created in dielectrically isolated (DI) wafers during the wafer thinning process by introducing a highly-strained layer near the back surface of the polysilicon support structure B of the DI wafer.

2. Description of the Prior Art

At one stage in the processing of dielectrically isolated (DI) wafers, the single crystal (100) silicon substrate must be thinned by a process which utilizes conventional grinding techniques. The grinding of the silicon substrate results in thinning the supporting single crystal part of the composite structure such that the subsequent removal of a portion of the single crystal results in wafer deformation of approximately $0.010''\pm0.001''$, where the positive sign of deformation indicates concave warpage of the thick polysilicon layer viewed from the polysilicon side which covers the silicon substrate. The drastic increase in wafer warpage during the grinding process, often referred to as springback, is undesirable as it places undesirable constraints on the ability to subject the wafers to automatic handling during subsequent IC processing, and may also cause irreversible structural damage in the single crystal tubs.

In order to overcome this springback problem, it was recognized that the creation of a subsurface damaged layer in the polysilicon would mitigate the affects of the springback problem during the substrate thinning process. In one method, subsurface damage can be created by locally melting the top $0.006''-0.008''$ of the polysilicon layer by utilizing lasers, electron beams, scanned strip heaters, or extended radiative heat sources (e.g., tungsten halogen lamps), followed by rapid solidification of the melted layer. These rapid thermal processes, as described in *Laser and Electron Beam Interactions with Solids,* (North-Holland, 1982) B. R. Appleton et al, Eds., and further described in *Laser-Solid Interactions and Transient Thermal Processing of Materials* (North-Holland, 1983), J. Narayan et al, Eds, function to create a structurally different polysilicon layer including a distinct interface which is capable of lessening the degree of springback.

An alternative technique, referred to as SIMOX (Separation by IMplanted OXygen), uses a buried $SiO_2$ layer which is formed by a high dose ($10^{18}$ atoms cm$^{-2}$) deep oxygen-ion bombardment of the polysilicon layer. This technique is described in detail in the article "Formation of $SiO_2$ Films by Oxygen-Ion Bombardment", by M. Watanabe et al, appearing in *Japanese Journal of Applied Physics,* Vol. 5, 1966, at pp. 737-738. As described in the article by Watanabe et al, SIMOX can be utilized in this case immediately prior to or after the final polish operation of the (100) silicon substrate to create a polysilicon subsurface disturbed layer. A further discussion of the SIMOX process can be found in the article "C.M.O.S. Devices Fabricated on Buried $SiO_2$ Layers Formed by Oxygen Implantation Into Silicon", by K. Izumi et al, appearing in *Electronics Letters,* Vol. 14, No. 18, Aug. 31, 1978, at pp. 593-594.

Another alternative technique utilizing partial amorphorization of the top polysilicon surface prior to final polishing by a channeled silicon ion implant may also be utilized to create a subsurface damaged layer capable of reducing springback. Reference to this procedure may be found in the article "Disorder Produced by High-Dose Implantation in Si+", by L. Csepregi et al, appearing in *Applied Physics Letters,* Vol. 29, No. 10, Nov. 15, 1976, pp. 645-648.

A problem with all of the above-described processes, however, is that the polysilicon deposition must be completed before any of these techniques may be used. Additionally, all of these methods are complex, high temperature procedures which are rather expensive and not easily amenable to production. Furthermore, the disturbed layer formed by the above-described processes will not be able to generate a sufficient opposing force against the severe warpage springback which occurs in DI substrates. Therefore, a need remains in the prior art to provide a method for reducing springback which does not require significant additional processing and, ideally, may be directly incorporated into the polysilicon deposition process.

SUMMARY OF THE INVENTION

The foregoing problems associated with the prior art have been solved in accordance with the present invention which relates to a method for reducing substrate warpage and, more particularly, to a method for reducing the warpage associated with the substrate thinning process by the creation of a highly-strained layer near the backside of the polysilicon structure.

It is an aspect of the present invention to provide a technique for decreasing the springback associated with DI wafers from a value of approximately 10.7 mils to a value of approximately 6.0 mils or lower by interrupting the polysilicon deposition process at a predetermined point in time so as to create a polysilicon subsurface damaged layer at a point approximately 14 mils from the isolation oxide interface. In one method of the present invention, referred to as dual polysilicon grinding, a polysilicon layer is deposited on the isolation oxide and then ground to create a highly stressed layer. A second polysilicon layer is subsequently deposited, where the stressed layer created by the initial polysilicon grinding operation will remain intact during the remainder of the deposition process and subsequent mechanical processing of the DI wafers.

An alternative aspect of the present invention is to modify the multilayering technique disclosed in U.S. patent application Ser. No. 680,140, filed Dec. 10, 1984 assigned to like assignee, to provide a novel method of creating a substructurally damaged layer in the polysilicon layer. In particular, during either a thermal or chemical multilayering process a large decrease in the polysilicon growth rate is achieved by a sudden quench in the deposition temperature around the 4.5 to 5th cycle of the multilayering process. This sudden quench will generate a localized substructural discontinuity and a highly defective layer about $0.014''$ from the isolation oxide.

A further aspect of the present invention is to provide a subsurface damaged layer by altering the abovedescribed multilayering technique by growing a layer of either $SiO_2$ or $Si_3N_4$ during the quench period of the multilayering process, where the remaining polysilicon is deposited on this layer to attain the desired thickness.

Other and further aspects of the present invention will become apparent during the course of the following discussion and by reference to the accompanying drawings.

BRIEF DESCRIPTION OF THE DRAWINGS

Referring now to the drawings,

FIGS. 1 and 1a–1d illustrates schematically the process steps and the corresponding DI wafer warpage at various stages of the substrate thinning process;

FIGS. 4A–4F illustrates schematically the steps involved in the creation of a subsurface interface layer in accordance with an alternative process of the present invention, where in this embodiment the interface layer is created by growing a film ($SiO_2$ or $Si_3N_4$) over the polysilicon layer onto which a second polysilicon layer is deposited;

FIGS. 5 and 6 illustrate the probability distribution in wafer warpage at various stages of the substrate thinning process illustrated in FIG. 1 for the polysilicon structure formed in accordance with the method illustrated in FIG. 4B using a 3000 A $SiO_2$ layer and a 3000 A $Si_3N_4$ layer, respectively;

FIGS. 7A–7B illustrates schematically the thermal sequence of the polysilicon deposition temperature for generating a subsurface disturbed layer in accordance with yet another alternative process of the present invention, where this disturbed layer is created by incorporating a thermal quench after either five cycles (FIG. 7A) or four and a half cycles (FIG. 7B) of the standard multilayering process;

FIGS. 8 and 9 illustrate the wafer warpage distribution at various stages of the substrate thinning process illustrated in FIG. 1 for the polysilicon structure deposited using the methods of FIGS. 7A and 7B, respectively;

FIG. 10 illustrates the wafer warpage distribution after the final polishing of the (100) Si substrate, as illustrated in FIG. 1D, for various perturbations in DI processing as used in association with the present invention;

FIGS. 12A–12C illustrates the SEM morphology of both the multilayer structure (associated with FIG. 7A) and the dual polysilicon grind structure (illustrated in FIG. 2), formed in accordance with the present invention.

DETAILED DESCRIPTION

Figure 1:
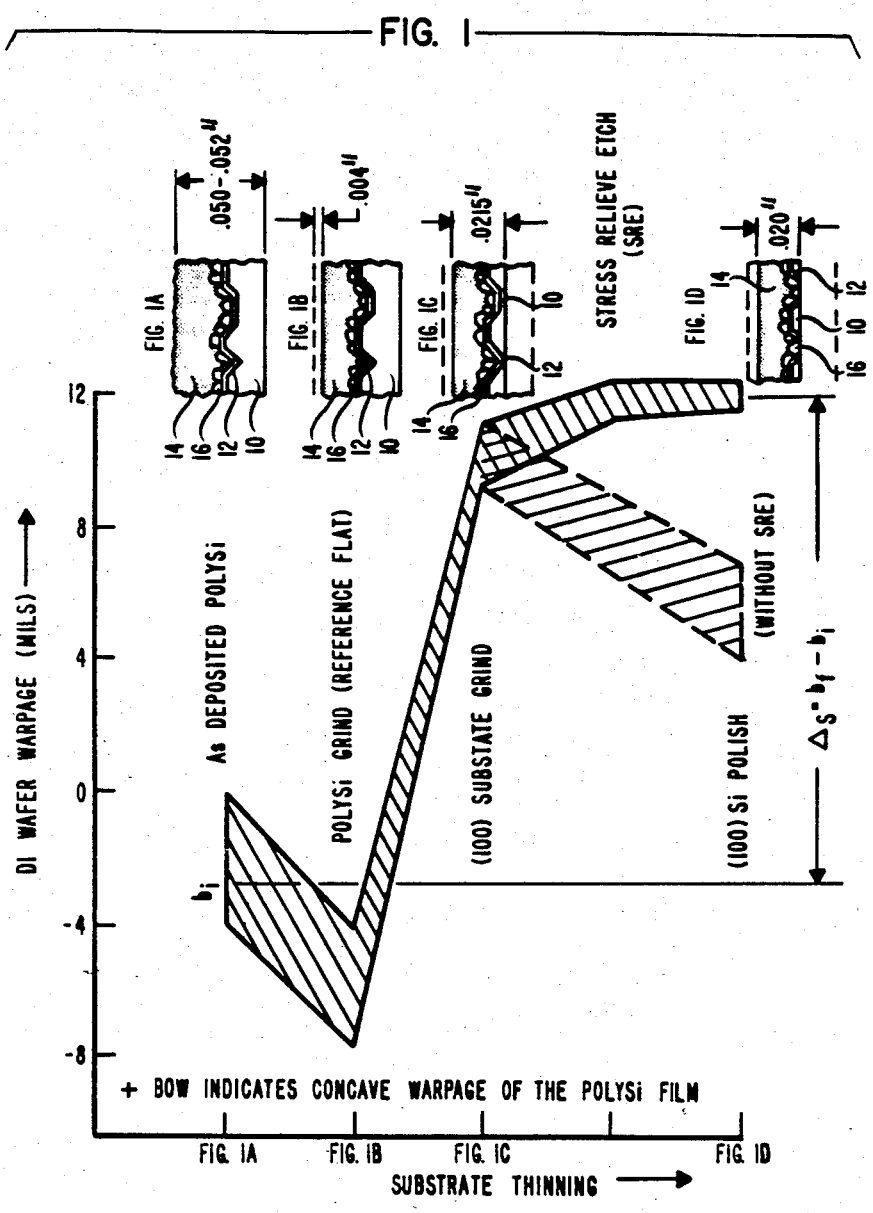

In order to provide a clearer understanding of the present invention, the portion of the DI wafer process which creates the springback problem will be briefly discussed. FIGS. 1A–1D illustrate the pertinent steps in this part of the process. The starting point, as shown in cross-section in FIG. 1A, is a (100) silicon substrate 10 which has been previously processed to contain the grooves, or moats, shown. A silicon dioxide isolation layer 12 has been grown over substrate 10 and a thick poysilicon layer 14 is subsequently deposited over silicon dioxide layer 12. This layer, referred to in the art as a "polysilicon handle", is utilized merely to fill up the moats and provide a reference surface for later mechanical processing. Copending application Ser. No. 680,140 assigned to the assignee of the present application, describes a process for depositing polysilicon layer 14 which is capable of accommodating the stress related to the deposition of a thick polysilicon layer. According to the process as described in this copending application, a recrystallized polysilicon layer 16 with a <100> texture will form at the interface between silicon dioxide layer 12 and the columnar <110> oriented polysilicon layer 14. Recrystallized polysilicon layer 16 in thus included in the steps illustrated in FIGS. 1A–1D for the sake of completeness. However, it is to be understood that such inclusion is exemplary only and the process of the present invention is equally applicable to other methods of forming polysilicon layer 14 on silicon dioxide, or any other insulating layer 12. As shown in FIG. 1A, the complete structure comprises a height of between 0.050" and 0.052" after a typical polysilicon handle deposition.

The next step in the mechanical processing involves an edge grinding operation (which may use a conventional belt sander) to remove any polysilicon grown abnormally near the wafer edges. The wafers are then mounted, for example, on ferrite mounting blocks, for the polysilicon grinding operation illustrated in FIG. 1B. As shown, approximately 0.004" of the top of polysilicon layer 14 is removed to yield a surface approximately 0.0177" above isolation oxide 12 which is parallel to the bottom surface of single crystal silicon substrate 10. Subsequent to the polysilicon grinding step the wafers are demounted and substrate 10 is thinned by a conventional grinding process (using vacuum mounting of the wafer to the grinder) until the bottom of the grooves are almost visible, as shown in FIG. 1C. At this point, the structure will comprise a height of approximately 0.0215". Following this substrate grinding step the composite structure is ground from a typical diameter of approximately 3.970" to a final DI wafer diameter of approximately 3.940". A substrate particulate cleaning operation, referred to as a Stress Relieved Etch (SRE), is next performed to remove silicon particles that are generated during the grinding operation and become loosely attached on or embedded in the DI wafers. The SRE operation consists of etching the structure at a temperature of 30° C. in a 4$HNO_3$:HF:2 acetic acid solution for 15 to 30 seconds. This process will remove about 0.025 to 0.050 mils of the polysilicon layer. This particle problem, unless taken care of by the SRE, can cause serious problems in the many subsequent photoresist operations. The final substrate thinning operation is the polishing of single crystal substrate 10 using a conventional dual polishing technique. The initial polish involves using a 5% suspended solution of powdered $SiO_2$ precipitate (1 $\mu$m) until approximately 80% of the single crystal material remaining after the substrate grinding step is removed. This is followed by the final polishing in a colloidal $SiO_2$ solution (10–13$\times 10^{-3}$ $\mu$m particle size) at a pH of approximately 11 until the final specified thickness of 0.020" is attained, as shown in FIG. 1D.

FIG. 1 also illustrates the changes in warpage of substrate 10 associated with the various steps described above in association with FIGS. 1A-1D. As can be seen, at the end of the polysilicon deposition process (FIG. 1A), wafers are found to have an average warpage of between 0 and −0.005″. During the polysilicon grind operation, the warpage is seen to slightly increase in the negative direction, to an average value of between −0.004″ and −0.008″. The subsequent substrate grind, illustrated in FIG. 1C, thins the stiffening member this composite structure and results in a severe change in wafer warpage to an average value of between 0.009″ and 0.011″, where these positive values indicate the presence of concave warpage (+) as viewed from the polysilicon side. Stress relieve etching is seen to slightly increase the concave warpage (+) to approximately 0.010″ to 0.012″, after which there is very little change in wafer warpage during the final polishing. However, if the final polishing is done without first performing stress relieve etching subsequent to the (100) Si grinding, there is a substantial reduction in the final warpage to an average value between 0.005″ and 0.008″. The total springback in wafer bow, denoted $\Delta_s$, is defined as the change in wafer bow between the polysilicon deposition step (FIG. 1A) and the final wafer polishing step (FIG. 1D). In particular, the following empirical equation may be used to define springback:

$$\Delta_s = b_{final} - b_{poly} = 10.7 - 0.64 b_{poly} \quad (1)$$

Figure 2:
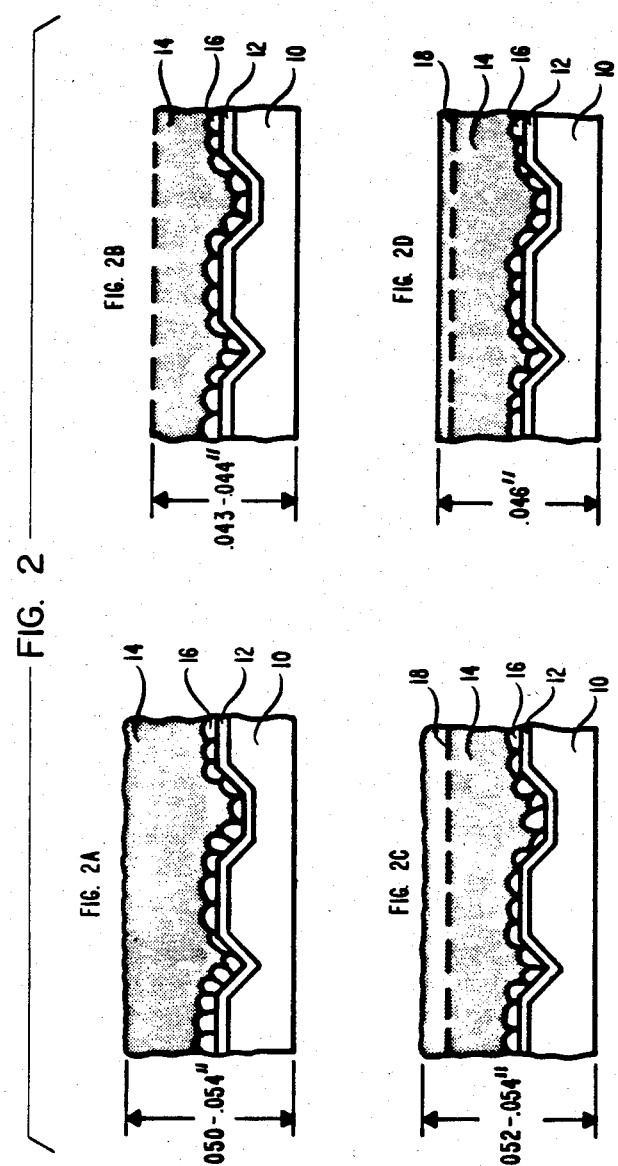
FIGS. 2A–2D illustrates the steps involved in the creation of a subsurface damaged layer in accordance of the method of the present invention, where in this embodiment, the damaged layer is created by performing a dual grinding operation on the polysilicon.

As seen by reference to equation (1) and FIG. 2, under the normal polysilicon deposition process using the conventional substrate thinning operation described in association with FIGS. 1A-1D, the wafer warpage is approximately +10.7 mils, where this figure is about 5 mils above the upper limit acceptable for automatic handling used for various photoresist operations during device processing. If the SRE operation is not utilized, $b_{final}$ is in the range of 6.5±1.5 mils. This decrease in $\Delta_s$ is believed to be due to the presence of a highly stressed layer generated during the polysilicon grinding operation (FIG. 1B) which will remain in the polysilicon handle in the absence of a SRE operation to provide some restraining force against the wafer springback. A remaining problem, therefore, is a way of providing a $b_{final}$ in the latter range while still allowing the SRE operation to be utilized. The basic premise of the present invention, therefore, is to artificially create a subsurface layer within the polysilicon handle which will remain intact subsequent to the SRE operation.

The present invention discloses a technique for reducing springback to an acceptable level wherein this technique is incorporated into the actual polysilicon deposition process, and, therefore, does not require the modification of any subsequent processing, including the use of stress relieve etching. In particular, the present technique comprises a method for reducing springback by interrupting the polysilicon deposition procedure so as to create a "strained" layer at an appropriate location in the polysilicon structure. As described in detail hereinafter, this method of creating a subsurface damaged layer includes, but is not limited to, performing a polysilicon grind at an intermediate point in the deposition process or perturbing the cyclic variation in a growth parameter associated with the multilayering deposition disclosed in copending application Ser. No. 680,140.

As mentioned above, artificial introduction of the strained polysilicon subsurface layer can be attained by a dual polysilicon grind operation, as illustrated in FIG. 2. FIG. 2A shows the starting material for the dual polysilicon grind process, where the material is identical to the starting material for the prior art process illustrated in FIG. 1A. FIG. 2B illustrates the result of a first polysilicon grind which results in removing between 0.007″ and 0.011″ of polysilicon from the top of polysilicon layer 14. The purpose of the first polysilicon grind is to create a highly stressed layer 18 that will be retained in polysilicon layer 14 during the subsequent processing steps. At the completion of this first polysilicon grind, a 0.006″ polysilicon film is renucleated and grown, as shown in FIG. 2C. A second polysilicon grind follows the completion of the polysilicon growth, as shown in FIG. 2D, to provide a reference flat surface for subsequent (100) Si grind and polish operations. As seen by reference to FIG. 2D, damaged layer 18 created during the first polysilicon grind operation is retained after the SRE operation and functions to reduce springback.

Figure 3:
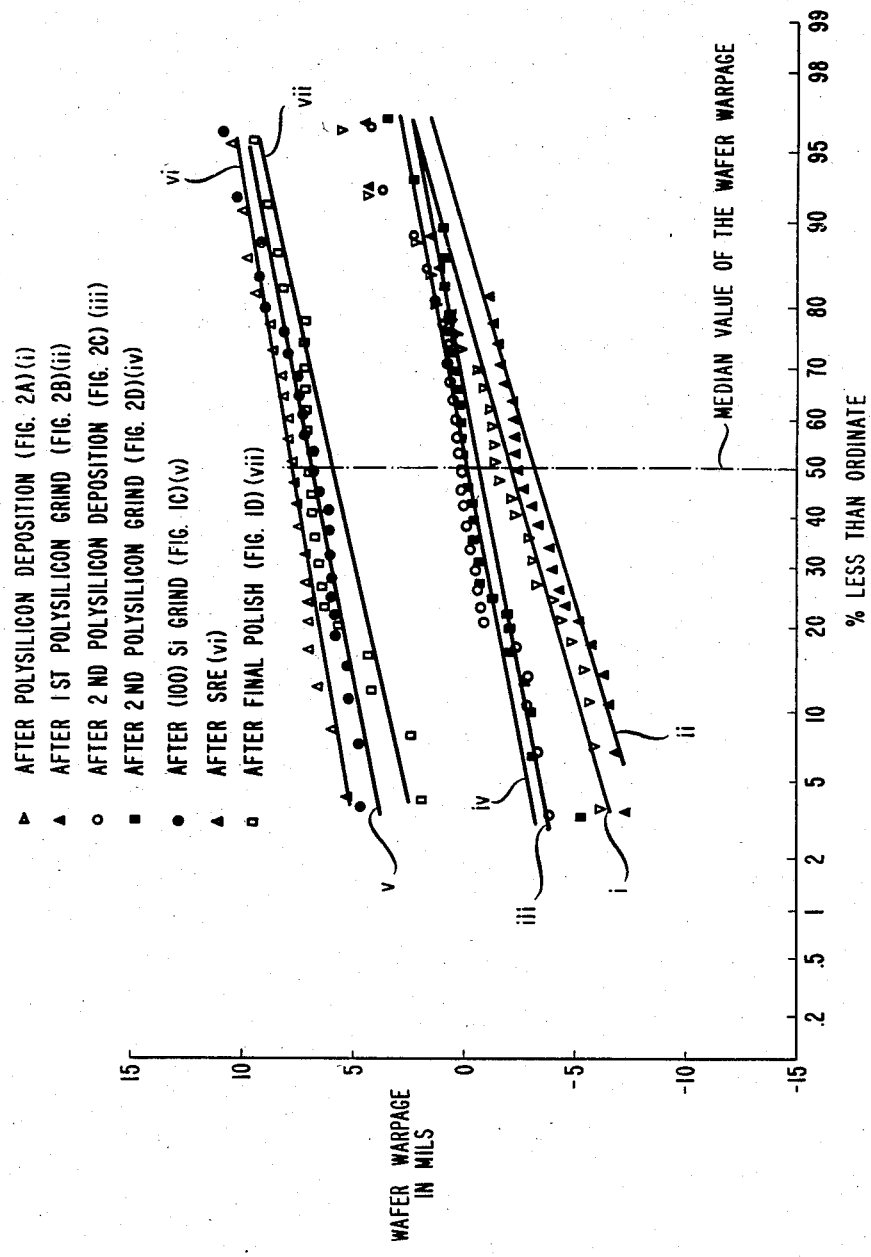
FIG. 3 illustrates the probability distribution in wafer warpage at various stages of the process illustrated in FIG. 1 for the polysilicon structure formed in accordance with the technique illustrated in FIG. 2.

FIG. 3 illustrates the probabililty distribution of warpage data for two separate lots of wafers at various stages of the process illustrated in FIGS. 2A-D. Distribution curve (i) in FIG. 3 represents the wafer bow after a standard polysilicon deposition process (with a median value of −1.5 mils), as shown in FIG. 2A. Curve (ii) in FIG. 3 refers to the bow data after the first polysilicon grind operation (FIG. 2B) associated with the creation of a subsurface strained layer in accordance with the present invention and indicates a median value of −6.5 mils. These wafers are subsequently returned to the reactor for a second polysilicon deposition of 6-8 mils (FIG. 2C), using either the multilayering process disclosed in copending application Ser. No. 680,140 or an 1100° C., 45 minutes conventional prior art isothermal polysilicon deposition process. The warpage data associated with this polysilicon deposition step is shown in distribution plot (iii) of FIG. 3, which illustrates a median warpage value of 0 mils. Subsequent warpage probability distribution plots (iv), (v), (vi), and (vii) relate to standard process data for the (100) Si substrate thinning operation. As seen by reference to FIG. 3, warpage springback $\Delta_s$ is reduced to an average value of between 7 and 9 mils, and the final bow of the wafers formed in accordance with the dual polysilicon grind process of the present invention is in the range of +7 mils, instead of the +10.5 mils associated with prior art substrate thinning techniques.

An alternative method of creating a localized strained layer is to generate a subsurface interface layer within the polysilicon handle. To accomplish this, the multilayering process disclosed in copending application Ser. No. 680,140 is terminated after four and a half or five cycles of multilayering, which results in the formation of a polysilicon handle thickness of approximately 0.015″, as shown in FIG. 4A. An interface layer 18 of $SiO_2$ or $Si_3N_4$ is subsequently grown on polysilicon handle 14, where a thickness of 3000 Å for interface layer 18 has been found to be sufficient for the purpose of the present invention, although other thicknesses may also be used. The oxide interface film can be grown by a pyrogenic stream oxidation of 1050° C. and the nitride interface film by an LPCVD reduction reaction $NH_3$:$SiH_2Cl_2$ at 800° C., although other techniques may also be used. A second polysilicon layer is then grown, using one or two cycles of multilayering, on top of interface layer 18 (after an in situ HCl gas cleaning of interface layer 18 at 1150° C.) to attain the desired thickness of the polysilicon handle, as shown in FIG. 4C.

The subsequent polysilicon grinding and conventional SRE steps previously discussed will not remove interface layer 18, as shown in FIG. 4D. Therefore, interface layer 18 will continue to provide an opposing force against springback during the subsequent substrate grinding (FIG. 4E).

FIGS. 5 and 6 show the warpage distribution data using an $SiO_2$ and $Si_3N_4$ interface layer (3000 A thick), respectively, at various stages in the mechanical processing of DI wafers illustrated in FIGS. 4A–F. Distribution curve (i) represents the wafer bow at the end of the first polysilicon deposition, i.e., after 4.5 or 5 cycles of multilayering. Curve (ii) represents the distribution in warpage data after the second polysilicon deposition (1.5 or 2 cycles) on an $SiO_2$ interface layer 18 (FIG. 5), or an $Si_3N_4$ interface layer 18 (FIG. 6). The median warpage value after the second polysilicon deposition is increased from approximately −2.0 mils to +1.0 mils when a 3000 A thick $SiO_2$ interface layer 18 is used. In comparison, the corresponding change in the median warpage after the second polysilicon deposition associated with a 3000 A $Si_3N_4$ interface layer 18 is from −3.0 mils to −1.0 mil. Subsequent warpage data in FIGS. 5 and 6 are associated with the conventional substrate thinning operations shown in FIGS. 1B–1D and previously described in association with FIG. 3. The median warpage after the final polish, using the oxide and nitride subsurface layers shown in FIGS. 5 and 6 are +8.0 mils and +8.5 mils, respectively, indicating a smaller reduction in springback than that which can be achieved using the previously described dual grinding process. However, the strained interface created by the dual polysilicon grinding process (FIG. 2) will, in general, be annealed out during prolonged, high temperature heat treatments, which are used in the fabrication of dielectric isolated devices. In comparison, the above-described $SiO_2$ or $Si_3N_4$ interface layer is stable under thermal treatments. Therefore, a recrystallizing anneal of the handle at 1410° C. to regrow the polysilicon from <110> to <100> texture, as described in copending application Ser. No. 681,270, assigned to the assignee of the present application, can be utilized after the polysilicon grinding step (FIG. 1B). Additionally, the SRE operation may be replaced in this case by a high pressure or brush scrubbing technique to gain another reduction of 3 to 5 mils in $\Delta_s$.

As previously stated, an alternative (and most elegant) method of generating a subsurface damaged layer during polysilicon deposition is to alter the growth parameter associated with the multilayering deposition technique disclosed in copending application Ser. No. 680,140, at a predetermined point in the multilayering cycle. If, for example, the thermal multilayering process is utilized, a large decrease in the polysilicon growth rate by a sudden quench in the deposition temperature around the 4.5 to 5th cycle of multilayering will generate a highly defective layer about 0.014" from isolation oxide layer 12. Similarly, a sudden drastic decrease in polysilicon growth by a quench in deposition temperature and/or a drastic lowering in the relative concentrations of the silicon-containing gaseous reactants ($SiH_4$, $SiHCl_3$) in the reaction zone around the four and a half to fifth cycle of the chemical multilayering process will generate a subsurface strained layer within the polysilicon support structure. This process, hereinafter referred to as the modified multilayering process (MML), is shown in FIG. 7.

FIG. 7A illustrates the sequence of steps associated with a thermal MML process where five complete multilayering cycles between a $T_U$ of 1210° C. and $T_L$ of 1180° C. are completed before the temperature is dropped to approximately 1120° C. (defined as $T_Q$) for 30 minutes, followed by a cycle of multilayering to attain the desired handle thickness. Alternatively, FIG. 7B illustrates a thermal MML process wherein the quench to 1120° C. occurs after the end of the first half of the fifth cycle of polysilicon deposition at $T_U$ of 1210° C. At the end of the $T_Q$ quench period, another one and a half cycles of multilayering is completed, starting at $T_L$. The localized defective layer created by this sudden quench will remain intact during the following polysilicon grind and SRE operations to provide a restraining force when the (100) Si substrate is removed. Although not illustrated, the chemical MML process of the present invention, as stated above, also produces a strained interface layer. In particular, five complete chemical multilayering cycles are first performed using a first growth rate, $G_1$ of approximately 4.35 μm/minute (using $X_{SiH_4}=0.0136$, $X_{SiHCl_3}=0.0409$, and $X_{H_2}=0.9455$) and a second growth rate, $G_2$, of approximately 3.75 μm/minute (using $X_{SiHCl_3}=0.0415$ and $X_{H_2}=0.9585$), where the depositions at both $G_1$ and $G_2$ occur at a reaction temperature of approximately 1175° C. To create the highly defective layer, the reaction temperature is then reduced to approximately 1120° C. (either at the midpoint or end of the fifth cycle, as illustrated in FIG. 7), and the polysilicon deposition is continued for approximately 30 minutes using the molar concentrations of silicon containing gaseous reactants associated with the growth rate of 3.75 μm/minute. As with the thermal MML process, the remaining polysilicon is deposited using either one or one half cycles of conventional chemical multilayering to acquire the desired thickness of the polysilicon handle. The localized disturbed layer created by this sudden quench in reaction temperature during the chemical MML process will be retained within the handle during subsequent wafer processing.

FIGS. 8 and 9 show probability distribution of wafer warpage after various steps of the substrate thinning process illustrated in FIGS. 2A–2D, where the polysilicon was deposited in the manner described above in association with FIGS. 7A and B, respectively. The warpage distribution curves (i) in FIGS. 8 and 9 represent the wafer bow after a modified multilayering deposition cycle of the present invention, showing a median warpage value of −2.00 mils (FIG. 7A) and −2.50 mils (FIG. 7B), respectively. After a conventional polysilicon grinding step (FIG. 1B), the respective median warpage values, as shown in curves (ii) of FIGS. 8 and 9, are −5.0 mils and −6.0 mils. The remaining distribution curves (iii), (iv), and (v) in FIGS. 8 and 9 are respectively associated with the (100) Si grind (FIG. 1(C)), the SRE, and the final (100) Si polish (FIG. 1D). The median bow using the MML technique of the present invention, after final polish, is in the range of 6.00±0.050 mils. In comparison, equivalent control lots without the described modification in the multilayering process yield an average wafer bow in the range of 8.75±1.50 mils.

As a further variation of this MML process, a first quench (1120° C., 30 minutes) after the third cycle of multilayering may be utilized, followed by a second quench in polysilicon deposition temperature (1120° C., 30 minutes) after the fifth cycle of multilayering. This double quenching results in forming two spaced-apart disturbed layers which function to further reduce the wafer springback. Additionally, this MML technique of the present invention may be used without any subsequent SRE, where this procedure will generate an additional 3 to 5 mils reduction in $\Delta_s$ after the final polishing operation. However, these wafers will exhibit particle problems unless the SRE process is replaced by a thorough high pressure scrubbing of fine nylon brush scrubbing and cleaning. The particle problem may also be eliminated by a High Temperature Regrowth (HTR) of polysilicon layer 14 by a recrystallizing anneal at 1410° C. after the polysilicon grinding step (see copending application Ser. No. 680,140 assigned to the assignee of the present application). Alternatively, local melting of the top 50–100 μm layer of polysilicon will reduce $\Delta_s$ by another 4 mils. FIG. 10 shows the probability distribution in wafer warpage after the final polishing step (FIG. 1D) for various perturbations in the DI process which yield wafers with very little bow prior to device processing. The median warpage values for the polysilicon handle deposited in accordance with the present invention (MML process) are 3.8 mils when SRE is not used (FIG. 10(iii)) and 5.0 mils when HTR is used (FIG. 10(iv)). A conventional substrate thinning process which utilizes SRE will generate a median warpage value of 7.0 mils using the MML process of the present invention (FIG. 7), or a value of 9.5 mils using the conventional ML process described in copending application Ser. No. 680,140.

Figure 11:
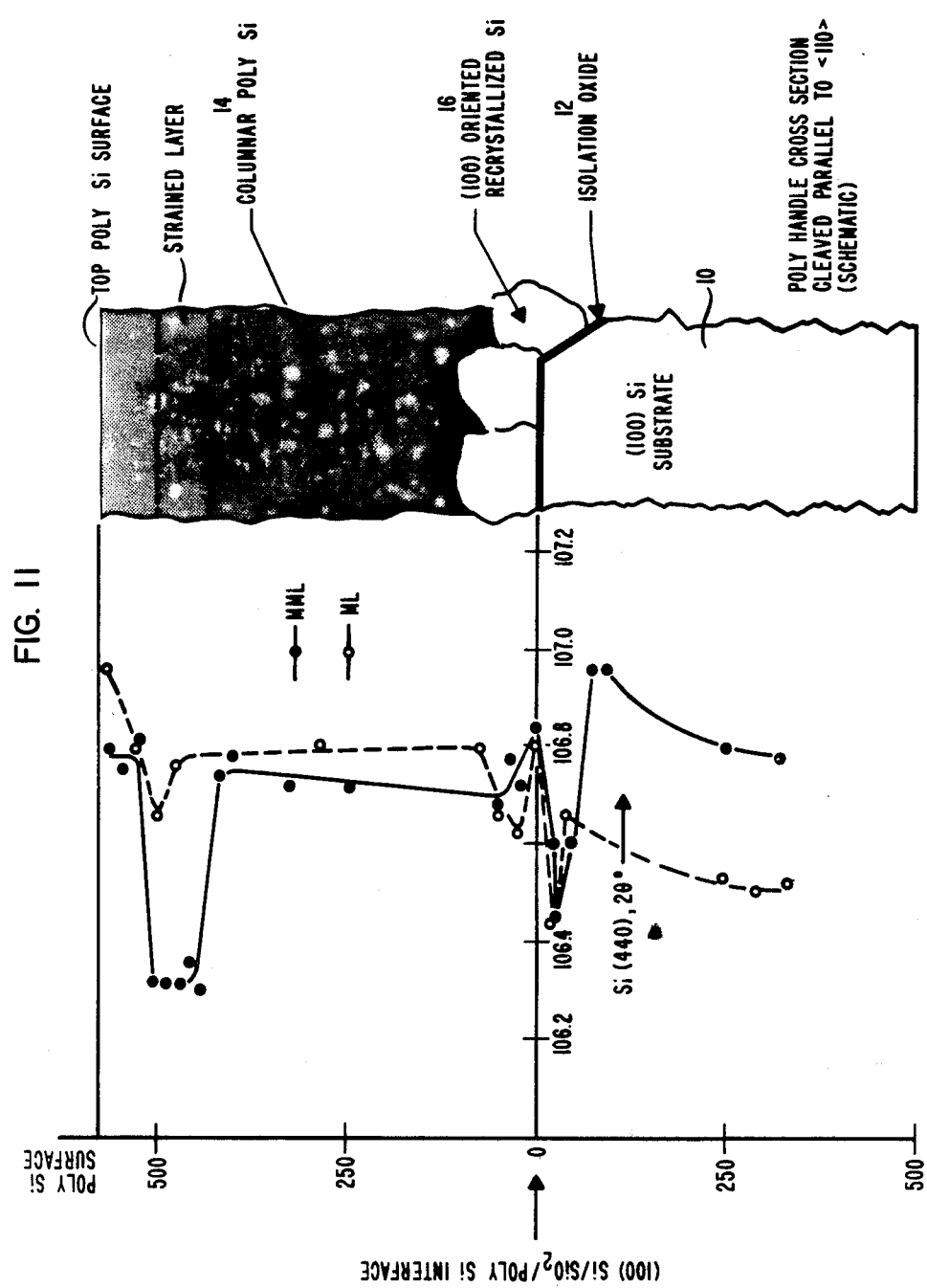
FIG. 11 illustrates the X-ray microdiffraction Si (440) Bragg peak position depth profile of the multicomponent "polysilicon/$SiO_2$/(100) Si" DI structure cross-section associated with a polysilicon layer formed in accordance with the method of the present invention illustrated in FIG. 7A.

The structural and substructural characterization of polysilicon layer 14 at various distances from isolation oxide layer 12 may be analyzed by X-Ray MicroDiffraction (XRMD) peak profiling of the Si (440), (531) and (400) Bragg peaks, and the morphological examination of the cleaved, polished and etched cross-sections of polysilicon layer 14 with SEM and optical microscopy where cleaved cross-sections for XRMD samples are made by cleaving along the [110] directions of the (100) Si substrate. The stress information on planes parallel to the cleavage directions [110] can easily be obtained from the Si (440) peak position shift by irradiating the cross-section at various depths in the polysilicon layer using a 30 μm monochromated CuKα (40 kV, 50 mA) incident X-ray beam. The stress values thus obtained can easily be converted to the stress value at the corresponding points on planes parallel to the polysilicon surface using reported elastic stiffness values for silicon. The Si (440) peak position profile or stress depth profile, shown in FIG. 11, indicates a relatively constant value along the entire cross-section of polysilicon layer 14, except for local minima at 75±10 μm from the polysilicon surface and about 40 μm below the isolation oxide in the (100) Si substrate. These local minima in the Si (440) peak position indicate the positions of the stress nodal surfaces. Both the ML and MML process of the present invention, as shown in FIG. 11, produce two nodal surfaces. However, the Si (440) peak position in the polysilicon subsurface shifted drastically to a much lower value of 106.3° for the MML process, as compared to the ML polysilicon film and annealed unstressed Si (440), 2θ value of 106.9°. Further, the local minimum in (440) peak position for the MML process of the present invention is much broader and typically extends from 60 μm to 120 μm below the top surface of the polysilicon layer, due to the presence of a pseudo interface created by the sudden quench in polysilicon growth. The relative (440) peak position near the top polysilicon surface can be strongly affected by the subsurface layer creation process of the present invention. Furthermore, the stress profile changes substantially along with the position of the top nodal surface by the subsequent substrate thinning steps shown in FIGS. 1B–D.

The warpage springback during a conventional, prior art (100) Si substrate grinding step (FIG. 1C) can be explained in terms of the removal of the stiffening component (100) Si substrate in the multistructured "(100)Si/SiO$_2$/polysilicon" entity. At the (100) Si material at or beyond the stress nodal surface is removed during the substrate grinding step, the polysilicon handle with isolated single crystal tubs relaxes back in the positive direction by an amount dictated by the overall stress profile. Therefore, it is apparent that springback, $\Delta_s$, can be substantially controlled by controlling the stress profile in the "(100)Si/SiO$_2$/polysilicon" structure. The polysilicon subsurface disturbed layer artificially created will remain within the polysilicon handle even after a conventional SRE operation to provide the opposing torque against the springback. Further, this localized strained layer created by the sudden quench in polysilicon growth-rate during the handle deposition, unlike that produced by the dual polysilicon grinding (FIGS. 2A–2D) process, is relatively more stable to thermal treatments incurred during device processing.

FIG. 12 contains micrographs of cleaved, polished and etch cross-sections of a polysilicon layer grown by various process perturbations to the multilayering process. The polysilicon morphology, illustrated in FIG. 12A, grown by the MML process of the present invention, as like the case of an ML polysilicon film, also shows a continuous sheet of large (100 μm) (100) oriented recrystallized grains followed by a columnar structure with <110> texture, without any sign of an interface at 60 μm to 120 μm below the top polysilicon surface, where, as discussed above, the XRMD stress depth profiling shows the presence of a localized strained layer about 75 μm below the top of polysilicon layer 14. Selective defect etching of the polysilicon cross-section (not illustrated) shows the presence of this substructurally disturbed layer. The interface created by the dual polysilicon grind process (FIG. 2), or the interrupted polysilicon deposition on an interface SiO$_2$ or Si$_3$N$_4$ layer (FIG. 4) is easily seen on the cleaved, polished and etched "polysilicon/SiO$_2$/(100) Si" cross-sections. The SEM photomicrographs of only the dual polysilicon grinding process associated with FIG. 2 is shown in FIGS. 12B and 12C. FIG. 12B clearly shows the presence of a second interface generated mechanically by the first polysilicon grinding operation, about 6 to 7 mils below the top polysilicon surface. FIG. 12C is a magnified (480×) view of the second interface. The morphology near the SiO$_2$ interface shows the presence of large (100) oriented recrystallized Si grains followed by the columnar polysilicon structure as observed on typical polysilicon films grown using the multilayering process. The morphology adjacent to the second interface consists of fine-graded (0.1–0.3 μm) polysilicon followed by a <110> oriented columnar structure, without any sign of (100) oriented recrystallized Si as observed near the SiO$_2$ interface.

In summary, the present invention relates to a process for generating an artificial subsurface strained layer in a polysilicon handle to reduce the springback in wafer warpage that occurs during the (100) Si substrate thinning for fabrication of DI substrates. The present invention describes two distinctly different approaches to create subsurface layers by forming either (i) a real or (ii) a pseudo interface within the polysilicon handle at the appropriate distance from the isolation oxide interface. The presence of this subsurface interface or disturbed layer will change the stress profile in the multicomponent "polysilicon/$SiO_2$/(100) Si" DI structure so as to favorably reduce the natural warpage springback that occurs when the stiffening component, (100) Si, is removed. The present invention describes the formation of a subsurface interface by growing a $SiO_2$ or $Si_3N_4$ film on top of a first layer of polysilicon and subsequently growing the remainder of the polysilicon on top of the $SiO_2$ or $Si_3N_4$ layer needed to attain the appropriate handle thickness. The present invention also describes an alternative method of forming a real interface by redepositing a second polysilicon layer over a mechanically ground polysilicon layer. However, the interface created mechanically is unstable to high temperature treatments that invariably occur during subsequent device processing. The sursurface pseudo interface or localized substructural discontinuity created by a sudden quench in the polysilicon growth rate incorporated directly into the actual polysilicon process, in accordance with the present invention, provides the most simple, elegant and cost effective solution for the warpage springback problem and allows for the automatic handling of the wafers during further processing.

What is claimed is:

1. A method of depositing a thick polysilicon layer on a dielectrically isolated wafer to include within said thick polysilicon layer of localized strained subsurface layer, said subsurface layer for reducing the springback warpage associated with the subsequent substrate thinning of said dielectrically isolated wafer, the method comprising the steps of:
   (a) depositing a first polysilicon layer on a top major surface of a dielectric isolated wafer to a predetermined polysilicon subsurface location;
   (b) interrupting the deposition process of step (a) at said predetermined polysilicon subsurface location so as to create said localized strained subsurface polysilicon layer;
   (c) completing the deposition initiated in step (a) over said strained subsurface polysilicon layer created in step (b) so as to form a thick polysilicon layer of a predetermined final height;
   (d) grinding the surface of said thick polysilicon layer formed in step (c).

2. The method according to claim 1 wherein in performing step (b), a grinding process is utilized to create the localized strained polysilicon layer.

3. The method according to claim 1 wherein in performing steps (a) and (c), a multilayering technique which utilizes cyclic variations in a predetermined growth parameter is used to deposit the polysilicon layer and in performing step (b), an interface layer is grown before completing the deposition of step (c).

4. The method according to claim 3 wherein the interface layer comprise $SiO_2$.

5. The method according to claim 3 wherein the interface layer comprises $Si_3N_4$.

6. The method according to claims 4 or 5 where the interface layer comprises a height of approximately 3000 A.

7. The method according to claim 3 wherein in performing step (b), said predetermined growth parameter is altered in a manner sufficient to create the localized strained layer before completing the polysilicon deposition of step (c).

8. The method according to claim 3 wherein in performing step (a), four and one-half cyclic variations in the predetermined growth parameter are performed to form a polysilicon layer comprising the predetermined first height above the top surface of the dielectrically isolated wafer.

9. The method according to claim 3 wherein in performing step (a), five complete cyclic variations in the predetermined growth parameter are preformed to form a polysilicon layer comprising the predetermined first height above the top surface of the dielectrically isolated wafer.

10. The method according to claim 3 wherein in performing steps (a) and (c), the reaction temperature is used as the predetermined growth parameter and is varied between a first, higher, temperature ($T_U$) and a second, lower, temperature ($T_L$) to form one multilayering cycle, and in performing step (b), the reaction temperature is decreased to a third temperature ($T_Q$) which is sufficiently low so as to create the substructurally strained polysilicon layer.

11. The method according to claim 10 wherein step (b) is repeated a predetermined number of times to create a predetermined number of strained polysilicon layers.

12. The method according to claim 10 wherein the first, higher, temperature ($T_U$) is approximately 1210° C., the second, lower temperature ($T_L$) is approximately 1180° C., and the third temperature ($T_Q$) is approximately 1120° C., wherein each half period of the multilayering cycles of step (a) is approximately 10 minutes in length, and the interruption period of step (b) is approximately 30 minutes in length.

13. The method according to claim 3 wherein in performing steps (a) and (c), the concentration of reactants is used as the predetermined growth parameter and is varied to yield a first, higher growth rate and a second, lower growth rate under isothermal conditions at a first temperature to form one multilayering cycle, and in performing step (b), the growth parameter is reduced to a third growth rate by reducing the reaction temperature to a second value which is sufficiently low so as to create the localized strained polysilicon layer.

14. The method according to claim 13 wherein in step (b) is repeated a predetermined number of times to create a predetermined number of strained polysilicon layers.

15. The method according to claim 13 wherein in performing steps (a) and (c), the reaction temperature is held at approximately 1175° C., the first, higher, growth rate is approximately 4.35 μm/minute using $X_{SiH4}=0.0136$, $X_{SiHCl3}=0.0409$ and $X_{H2}=0.9455$, and the second, lower growth rate is approximately 3.75 μm/minute using $X_{SiHCl3}=0.0415$ and and $X_{H2}=0.9585$, and in performing step (b), the reaction temperature is reduced to approximately 1120° C. and the growth rate is approximately 2.70 μm/minute using $X_{SiHCl3}=0.0415$ and $X_{H2}=0.9585$, wherein each half period of the multilayering cycles of step (a) is approximately 10 minutes in length, and the interruption period of step (b) is approximately 30 minutes in length.

* * * * *